(12) United States Patent
Kokubun

(10) Patent No.: US 7,994,556 B2
(45) Date of Patent: Aug. 9, 2011

(54) SEMICONDUCTOR MEMORY DEVICE HAVING AMORPHOUS CONTACT PLUG

(75) Inventor: Takeshi Kokubun, Suwa (JP)

(73) Assignee: Seiko Epson Corporation (JP)

( * ) Notice: Subject to any disclaimer, the term of this patent is extended or adjusted under 35 U.S.C. 154(b) by 26 days.

(21) Appl. No.: 11/677,156

(22) Filed: Feb. 21, 2007

(65) Prior Publication Data

US 2007/0194361 A1 Aug. 23, 2007

(30) Foreign Application Priority Data

Feb. 22, 2006 (JP) .................................. 2006-044861

(51) Int. Cl.
*H01L 21/02* (2006.01)
*H01L 27/108* (2006.01)
*H01L 29/94* (2006.01)
(52) U.S. Cl. ................. 257/296; 257/295; 257/E27.104
(58) Field of Classification Search .................. 257/296, 257/249, 295, 773, E27.104, E29.116, E29.158, 257/E29.164
See application file for complete search history.

(56) References Cited

U.S. PATENT DOCUMENTS

| 5,382,817 | A | 1/1995 | Kashihara et al. |
| 6,144,052 | A | 11/2000 | Kushida et al. |
| 2002/0047147 | A1* | 4/2002 | Kushida et al. ............... 257/295 |
| 2003/0173671 | A1* | 9/2003 | Hironaga et al. ............. 257/758 |
| 2003/0227043 | A1* | 12/2003 | Kutsunai ....................... 257/299 |
| 2004/0021222 | A1 | 2/2004 | Mori |
| 2004/0232468 | A1* | 11/2004 | Solayappan et al. .......... 257/310 |
| 2005/0087788 | A1 | 4/2005 | Kutsunai et al. |
| 2006/0124983 | A1 | 6/2006 | Kutsunai et al. |

FOREIGN PATENT DOCUMENTS

| JP | 05-299601 | 11/1993 |
| JP | 09-082913 | 3/1997 |
| JP | 10-144878 | 5/1998 |
| JP | 2001-345432 | 12/2001 |
| JP | 2002-043517 | 2/2002 |
| JP | 2004-071700 | 3/2004 |
| JP | 2004-186518 | 7/2004 |
| JP | 2004311868 A * | 11/2004 |
| JP | 2005-150688 | 6/2005 |
| WO | 97-33316 | 9/1997 |

OTHER PUBLICATIONS

English translation of JP2004311868 A.*

* cited by examiner

*Primary Examiner* — Anh Phung
*Assistant Examiner* — Allison P Bernstein
(74) *Attorney, Agent, or Firm* — Harness, Dickey & Pierce, P.L.C.

(57) ABSTRACT

A semiconductor memory device includes: a semiconductor substrate; a field effect transistor formed on the semiconductor substrate; an interlayer dielectric layer formed on the field effect transistor; a contact plug connected to the field effect transistor through the interlayer dielectric layer; and a ferroelectric capacitor disposed on the interlayer dielectric layer and connected to the contact plug, wherein a contact surface between a lower electrode of the ferroelectric capacitor and the contact plug is smaller than a contact plug surface of the contact plug.

11 Claims, 2 Drawing Sheets

SEMICONDUCTOR MEMORY DEVICE HAVING AMORPHOUS CONTACT PLUG

The entire disclosure of Japanese Patent Application No. 2006-044861, filed Feb. 22, 2006 is expressly incorporated by reference herein.

BACKGROUND

1. Technical Field

The present invention relates to semiconductor memory devices, and is particularly suitable when applied in controlling the crystal orientation in ferroelectric capacitors.

2. Related Art

In order to improve characteristics of ferroelectric capacitors in ferroelectric memories, a reset film may be provided to control the crystal orientation of a lower electrode. Also, in order to planarize a surface of a contact plug on which the lower electrode is formed, the surface of the contact plug is polished by a CMP method. Furthermore, for example, Japanese laid-open patent application JP-A-2001-345432 describes a method for improving oxidation resistance of capacitor electrodes without inhibiting an improvement in the degree of integration, in which a metal nitride layer is provided on a surface of an embedded conductive body embedded in an insulation layer, and a ferroelectric capacitor is provided on the metal nitride layer through an intermediate layer composed of a conductive oxide and having an oxygen barrier property.

However, in the ferroelectric memories described above, erosion, dishing and recess may be generated, when the surface of the contact plug is planarized by CMP, due to the difference in polishing rate between the contact plug and the insulation film in which the contact plug is embedded. For this reason, it is difficult to finish smoothly the surface of the contact plug on which the lower electrode is formed, and it is difficult to maintain well the surface condition and crystal structure of the base layer where the lower electrode is formed, such that ferroelectric capacitors with good characteristics cannot be formed. Furthermore, even when a reset film is provided according to the aforementioned reset film forming method, is it difficult to control accurately the crystal orientation of the lower electrode due to the difference in material (orientation property) between the plug and the insulation film in which the plug is embedded, such that ferroelectric capacitors with good characteristics cannot be stably formed.

SUMMARY

In accordance with an advantage of some aspects of the invention, it is possible to provide a semiconductor memory device that can improve the uniformity in the surface condition and crystal structure of a base layer in which a lower electrode connected to a contact plug is formed, and a method for manufacturing such a semiconductor memory device.

In accordance with an embodiment of the invention, a semiconductor memory device includes: a semiconductor substrate; a field effect transistor formed on the semiconductor substrate; an interlayer dielectric layer formed on the field effect transistor; a contact plug connected to the field effect transistor through the interlayer dielectric layer; and a ferroelectric capacitor disposed on the interlayer dielectric layer and connected to the contact plug, wherein a contact surface between a lower electrode of the ferroelectric capacitor and the contact plug is greater than a plug diameter of the contact plug.

By this, even when the field effect transistor is miniaturized, the contact plug surface that contacts the lower electrode can be relatively enlarged, such that pattern-dependency of the contact plug, and influences resulting from a difference in etching rate between the contact plug and the interlayer dielectric layer, such as, erosion, dishing and recess can be reduced. For this reason, the uniformity of surface state and crystal structure of the base layer where the lower electrode connected to the contact plug is formed can be improved, characteristics of the ferroelectric capacitor can be improved, and ferroelectric capacitors having excellent characteristics can be stably fabricated within the wafer surface.

In the semiconductor memory device in accordance with an aspect of the embodiment of the invention, the contact plug may have a cross section in a generally T-letter shape, and may be formed by a forming method including polishing by CMP, forming an upper layer structure, and etching together at the time of forming the capacitor.

By this, the contact plug surface that contacts the lower electrode can be enlarged without increasing the diameter of the contact plug that is connected to the field effect transistor. Accordingly, the smoothness of the contact plug surface that contacts the lower electrode can be improved while the field effect transistor can be miniaturized.

Moreover, a semiconductor memory device in accordance with an embodiment of the invention includes: a semiconductor substrate; a field effect transistor formed on the semiconductor substrate; an interlayer dielectric layer formed on the field effect transistor; a contact plug connected to the field effect transistor through the interlayer dielectric layer; and a ferroelectric capacitor disposed on the interlayer dielectric layer and connected to the contact plug, wherein the contact plug has a first portion embedded in the interlayer dielectric layer and a second portion protruding over the interlayer dielectric layer, and the ferroelectric capacitor has a laminated layer structure of a lower electrode, a ferroelectric film and an upper electrode disposed in a portion corresponding to the second portion of the contact plug.

By this, an upper end portion of the contact plug, and the lower electrode, the ferroelectric film and the upper electrode can be lined up and made in the same size, and the lower electrode can be prevented from being disposed across the contact plug and the interlayer dielectric layer. For this reason, the base layer that contacts the lower electrode can be composed of a uniform material in an aligned orientation, and the crystal orientation of the lower electrode can be made uniform, such that characteristics of the ferroelectric capacitor can be improved.

Also, in the semiconductor memory device in accordance with an aspect of the embodiment of the invention, the crystal structure of the lower electrode and the crystal structure of the contact plug are approximate to each other. By this, the crystal orientation of the lower electrode can be improved, and therefore the characteristics of the ferroelectric capacitor can be improved.

Furthermore, a method for manufacturing a semiconductor memory device in accordance with an embodiment of the invention includes the steps of: forming a field effect transistor on a semiconductor substrate; forming an interlayer dielectric layer disposed on the field effect transistor over the semiconductor substrate; forming an opening section in the interlayer dielectric layer; forming a first conductive film having a portion embedded in the opening section over the interlayer dielectric layer; planarizing the conductive film such that a portion of the first conductive film remains on the interlayer dielectric layer; successively laminating a second conductive film, a ferroelectric film and a third conductive film on the first conductive film; forming a resist pattern and a hard mask greater than the opening section on the third conductive film; patterning the third conductive film, the dielectric film, the second conductive film and the first conductive film by using the resist pattern as a mask, to form a contact plug embedded in the opening section and having a portion protruding over the interlayer dielectric layer, and to form a laminated structure of a lower electrode, a ferroelectric film and an upper electrode disposed on the contact plug.

By this, influences resulting from a difference in etching rate between the contact plug and the interlayer dielectric layer, such as, erosion, dishing and recess can be reduced, the smoothness of the contact plug surface that contacts the lower electrode can be improved, and an upper end portion of the contact plug, and the lower electrode, the ferroelectric film and the upper electrode can be lined up and made in the same size without a positional deviation among the contact plug, and the lower electrode/the ferroelectric film/the upper electrode. For this reason, the uniformity of surface state and crystal structure of the base layer where the lower electrode that is connected to the contact plug is formed can be improved, characteristics of the ferroelectric capacitor can be improved, and ferroelectric capacitors having excellent characteristics can be stably fabricated within the wafer surface.

Also, the method for manufacturing a semiconductor memory device in accordance with an aspect of the embodiment of the invention further includes, after planarizing the conductive film, the step of amorphousizing a surface of the conductive film by irradiating ions on the surface of the conductive film.

By this, the crystal orientation of the surface of the contact plug can be readily controlled without using a reset film, and the characteristics of the ferroelectric capacitor can be improved while suppressing the complexity of the manufacturing process.

DESCRIPTION OF EXEMPLARY EMBODIMENTS

A semiconductor memory device and its manufacturing method in accordance with a preferred embodiment of the invention are described below with reference to the accompanying drawings. FIGS. 1A-1C and FIGS. 2A-2B are cross-sectional views showing a method for manufacturing a semiconductor memory device in accordance with an embodiment of the invention.

Figure 1A:
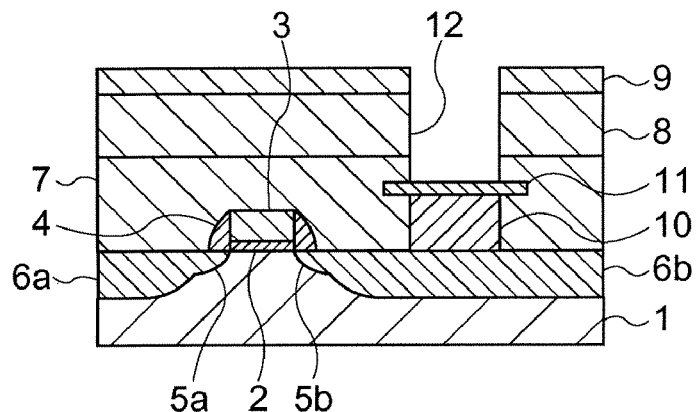
FIGS. 1A-1C are cross-sectional views showing steps of a method for manufacturing a semiconductor memory device in accordance with an embodiment of the invention.

FIG. 1A shows a semiconductor substrate 1, a gate electrode 3 formed through a gate dielectric film 2, and a side wall 4 formed on a side wall of the gate electrode 3. In the semiconductor substrate 1, source and drain layers 6a and 6b are formed on both sides of the gate electrode 3 through LDD layers 5a and 5b, respectively. Interlayer dielectric layers 7, 8 and 9 are successively laminated over the gate electrode 3. A contact plug 10 that is connected to one of the source and drain layers 6a and 6b is embedded in the interlayer dielectric layer 7, and an intermediate electrode 11 is formed on the contact plug 10. Also, an opening section 12 that exposes a surface of the intermediate electrode 11 is formed in the interlayer dielectric layers 7, 8 and 9. For forming the opening section 12 through the interlayer dielectric layer 7, 8 and 9, a dry etching method, a wet etching method or a method combining the aforementioned etching methods may be used.

The semiconductor substrate 1 may be composed of a material selected from, for example, Si, Ge, SiGe, SiC, SiSn, PbS, GaAs, InP, GaP, GaN and ZnSe. Also, as a material of the contact plug 10, for example, tungsten (W) may be used. As a material of the interlayer dielectric layer 7, a silicon oxide film may be used, and the film thickness of the interlayer dielectric layer 7 may be set to about 1000 nm. As a material of the interlayer dielectric layer 8, a silicon oxide film may be used, and the film thickness of the interlayer dielectric layer 8 may be set to about 600 nm. As a material of the interlayer dielectric layer 9, a silicon nitride film may be used, and the film thickness of the interlayer dielectric layer 9 may be set to about 600 nm. Furthermore, as a material of the intermediate electrode 11, a Ti/TiN structure may be used, and for example, the film thickness of the Ti film may be set to about 15 nm, and the film thickness of the TiN film may be set to about 170 nm.

Figure 1B:
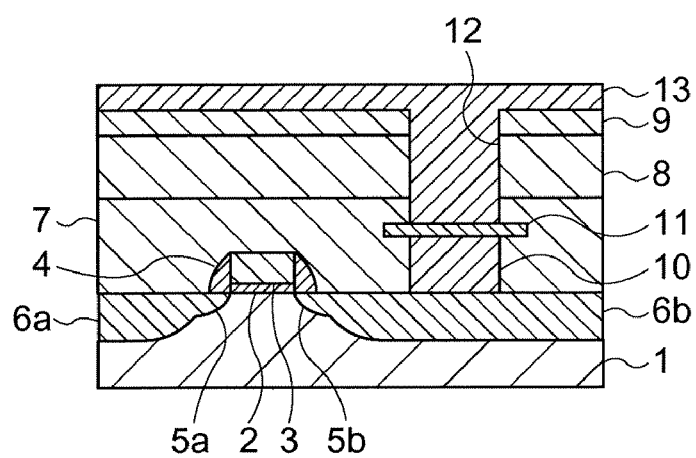

Next, for example, a sputter method, a chemical vapor phase growth method, a physical vapor phase deposition method, or a method appropriately combining the aforementioned methods may be used to form a conductive film 13 with a portion thereof embedded in the opening section 12 is formed on the interlayer dielectric layer 9, as show in FIG. 1B. It is noted that, before forming the conductive film 13 on the interlayer dielectric layer 9, a sputter method or the like may be used to successively grow films of Ti and TiN on the interlayer dielectric layer 9, thereby forming a barrier metal film on the interlayer dielectric layer 9. Then, a dry etching method, a wet etching method, a CMP method or a method appropriately combining the aforementioned methods may be used to planarize the conductive film 13 in a manner that the conductive film 13 remains on the interlayer dielectric layer 9 around the opening section 12. As the conductive film 13, for example, tungsten (W) may be used. It is noted that the film thickness of the conductive film 13 remaining on the interlayer dielectric layer 9 around the opening section 12 may be set to, for example, about several hundred to several thousand Angstrom.

By planarizing the conductive film 13 in a manner that the conductive film 13 remains on the interlayer dielectric layer 9 around the opening section 12, the interlayer dielectric layer 9 can be prevented from being exposed. For this reason, pattern-dependency of the opening section 12, and influences resulting from a difference in etching rate between the conductive film 13 and the interlayer dielectric layer 9, such as, erosion, dishing and recess can be reduced, and the uniformity of surface state and crystal structure of the base layer where a barrier film 14a that is connected to a contact plug 13a shown in FIG. 2A is formed can be improved.

It is noted that, after planarizing the conductive film 13, ion irradiation may be applied to the planarized surface of the conductive film 13 to amorphousize the surface of the conductive film 13. By this, the crystal orientation of the surface of the contact plug 13a shown in FIG. 2a can be readily controlled without using a reset film, and the characteristics of the ferroelectric capacitor can be improved while suppressing the complexity of the manufacturing process.

Figure 1C:
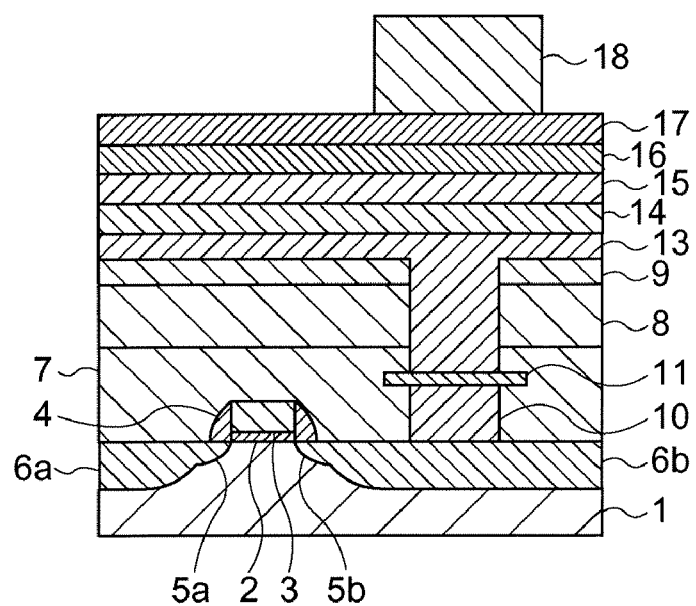

Next, as shown in FIG. 1C, a sputter method, a chemical vapor phase growth method, a physical vapor phase deposition method or a method appropriately combining the aforementioned methods may be used to form a barrier film 14, a conductive film 15, a ferroelectric film 16 and a conductive film 17 are formed on the conductive film 13. Then, a photolithography technique is used to form a resist pattern 18 corresponding to the shape of the ferroelectric capacitor is formed.

Figure 2A:
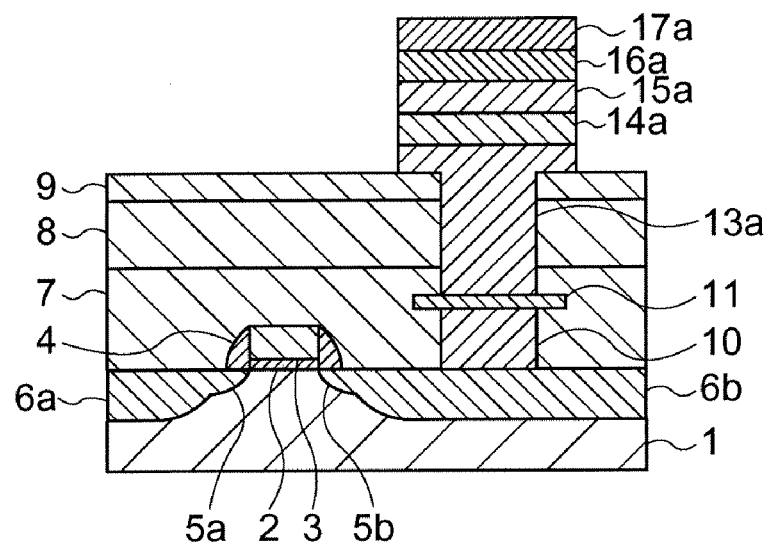
FIGS. 2A-2B are cross-sectional views showing steps of the method for manufacturing a semiconductor memory device in accordance with an embodiment of the invention.

Next, as shown in FIG. 2A, the conductive film 17, the ferroelectric film 16, the conductive film 15, the barrier film 14 and the conductive film 13 are successively etched by using the resist pattern 18 as a mask, thereby exposing the interlayer dielectric layer 9. As a result, a contact plug 13a embedded in the opening section 12 and having a portion protruded over the interlayer dielectric layer 9 around the opening section 12 is formed, and a laminated structure of a barrier film 14a, a lower electrode 15a, a capacitance dielectric film 16a and an upper electrode 17a disposed on the contact plug 13a is formed. It is noted that, as the barrier film 14a, for example, TiAlN may be used; as the lower electrode 15a, for example, a laminated structure of Pt/IrOx/Ir may be used; as the capacitance dielectric film 16a, for example, PZTN may be used; and as the upper electrode 17a, for example, a laminated structure of Ir/IrOx/Pt may be used.

By this, an upper end portion of the contact plug 13a, and the barrier film 14a, the lower electrode 15a, the capacitance dielectric film 16a, the upper electrode 17a (where HM material might be originally formed on the upper electrode 17a: for example, SiO$_2$, SiN or metallic HM material) can be lined up and made in the same size without a positional deviation among the contact plug 13a, and the barrier film 14a/the lower electrode 15a/the capacitance dielectric film 16a/the upper electrode 17a. For this reason, the lower electrode 15a can be prevented from being disposed across the contact plug 13a and the interlayer dielectric layer 9, and the base layer that contacts the lower electrode 15a can be composed of a uniform material in an aligned orientation, whereby the crystal orientation of the lower electrode 15a can be made uniform, and characteristics of the ferroelectric capacitor can be improved.

Also, the contact plug can be made to have a cross section in a generally T-letter shape, and therefore a contact plug surface that contacts the lower electrode 15a can be enlarged without increasing the diameter of the contact plug at a connecting section thereof connecting to the field effect transistor, such that the field effect transistor can be miniaturized, and the smoothness of the contact plug surface in contact with the lower electrode 15a can be improved.

Figure 2B:
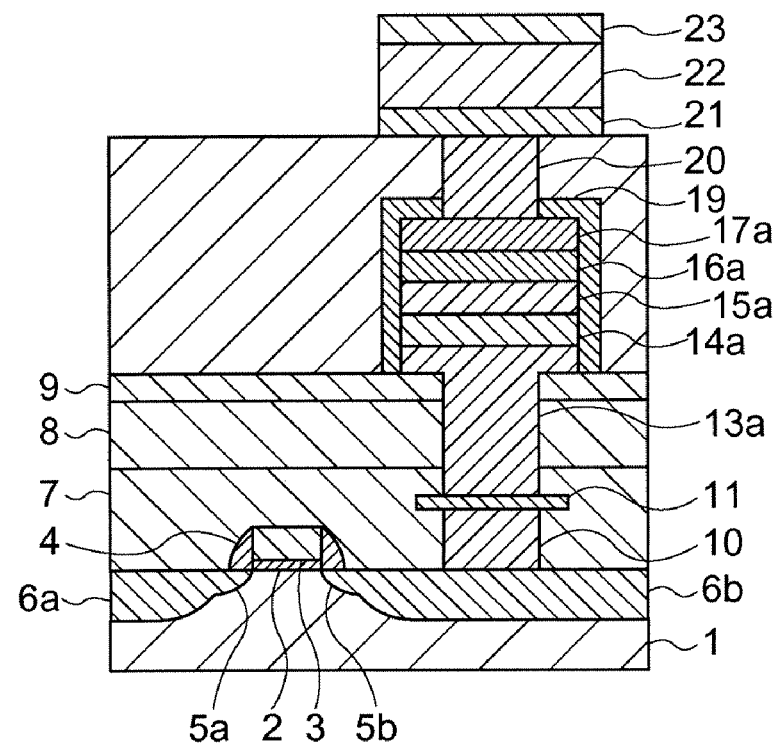

Next, as shown in FIG. 2B, a hydrogen barrier film 19 that covers the barrier film 14a, the lower electrode 15a, the capacitance dielectric film 16a and the upper electrode 17a is formed, and then an interlayer dielectric layer 21 is formed over the entire surface. It is noted that, as the hydrogen barrier film 19, for example, Al$_2$O$_3$ may be used. Then, after embedding a contact plug 20 that connects to the upper electrode 17a in an interlayer dielectric layer 21, for example, layers of Ti/TiN/Al—Cu/Ti/TiN are successively deposited on the dielectric layer by sputtering. The laminated layers of Ti/TiN/Al—Cu/Ti/TiN are patterned by using a photolithography technique and an etching technique, thereby forming a wiring layer 22 composed of a Ti/TiN/Al—Cu/Ti/TiN structure on the interlayer dielectric layer 21. It is noted that the film thickness of the layers of Ti/TiN/Al—Cu/Ti/TiN may be 15/100/500/15/60 nm, respectively.

It is noted that, as the wiring layer 22, for example, a TiN/Al—Cu/Ti/TiN structure, a TiN/Al/Ti/TiN structure, a TiN/Al—Cu/TiN structure, a TiN/Ti/Al/Ti/TiN structure, a Ti/TiN/Al—Cu/Ti/TiN structure, a Ti/TiN/Al/Ti/TiN structure, a Ti/TiN/Ti/Al—Cu/Ti/TiN structure, or a Ti/TiN/Ti/Al/Ti/TiN structure may be used, in addition to the Ti/TiN/Al—Cu/Ti/TiN structure described above.

Furthermore, a conductive reset film may be formed between the lower electrode 15a and the contact plug 13a.

What is claimed is:

1. A semiconductor memory device, comprising:
   a transistor;
   an interlayer dielectric film formed above the transistor;
   a metal contact plug having a first portion formed in the interlayer dielectric film, and a second portion formed on the first portion and on a part of the interlayer dielectric film, only a surface of the second portion being amorphous, the first portion and second portion being made of the same material and being formed monolithically;
   a barrier film formed on the second portion of the metal contact plug;
   a first electrode formed on the barrier film; and
   a capacitance dielectric film formed above the first electrode, and a second electrode formed above the capacitance dielectric film, the capacitance dielectric film, the first electrode and the second electrode being configured without a positional deviation from the second portion of the metal contact plug.

2. The semiconductor memory device according to claim 1, wherein the metal contact plug is formed of tungsten.

3. The semiconductor memory device according to claim 1, further comprising an intermediate electrode formed in the interlayer dielectric film.

4. The semiconductor memory device according to claim 1, wherein a diameter of the second portion of the metal contact plug is greater than a diameter of the first portion of the metal contact plug.

5. The semiconductor memory device according to claim 1, further comprising a hydrogen barrier film formed on a part of the second portion of the metal contact plug, a part of the first electrode, a part of the capacitance dielectric film and a part of the second electrode.

6. A semiconductor memory device, comprising:
   a transistor;
   an interlayer dielectric film formed above the transistor;
   a single piece T-shaped metal contact plug having integral horizontal and vertical portions, the entirety of the vertical portion being formed in the interlayer dielectric film, the entirety of the horizontal portion being formed above the interlayer dielectric film, a part of the horizontal portion directly contacting the interlayer dielectric film, only an upper surface of the horizontal portion being amorphous;
   a barrier film formed on the horizontal portion of the single piece T-shaped metal contact plug, the surface of the horizontal portion directly contacting the entirety of a lower surface of the barrier film; and
   a first electrode formed on the barrier film.

7. The semiconductor memory device according to claim 6, wherein the single piece T-shaped metal contact plug is monolithic and formed of tungsten.

8. The semiconductor memory device according to claim 6, further comprising a capacitance dielectric film formed above the first electrode, and a second electrode formed above the capacitance dielectric film, the entirety of each of the capacitance dielectric film, the first electrode and the second electrode overlapping with the horizontal portion of the single piece T-shaped metal contact plug.

9. The semiconductor memory device according to claim 8, further comprising a hydrogen barrier film formed on a part of the horizontal portion of the contact plug, a part of the first electrode, a part of the capacitance dielectric film and a part of the second electrode.

10. The semiconductor memory device according to claim 6, further comprising an intermediate electrode formed in the interlayer dielectric film.

11. The semiconductor memory device according to claim 6, wherein a diameter of the horizontal portion of the single piece T-shaped metal contact plug is greater than a diameter of the vertical portion of the single piece T-shaped metal contact plug.

* * * * *